(12) United States Patent
Kim

(10) Patent No.: US 9,781,863 B1
(45) Date of Patent: Oct. 3, 2017

(54) ELECTRONIC MODULE WITH COOLING SYSTEM FOR PACKAGE-ON-PACKAGE DEVICES

(71) Applicant: Microsemi Solutions (U.S.), Inc., Aliso Viejo, CA (US)

(72) Inventor: Daniel Kim, Burnaby (CA)

(73) Assignee: Microsemi Solutions (U.S.), Inc., Aliso Viejo, CA (US)

( * ) Notice: Subject to any disclaimer, the term of this patent is extended or adjusted under 35 U.S.C. 154(b) by 73 days.

(21) Appl. No.: 14/845,845

(22) Filed: Sep. 4, 2015

(51) Int. Cl.
| | |
|---|---|
| H05K 7/20 | (2006.01) |
| H01L 23/367 | (2006.01) |
| H05K 1/02 | (2006.01) |
| H01L 25/065 | (2006.01) |
| H01L 23/053 | (2006.01) |
| H05K 3/30 | (2006.01) |
| H01L 21/48 | (2006.01) |

(52) U.S. Cl.
CPC ....... *H05K 7/2039* (2013.01); *H01L 21/4882* (2013.01); *H01L 23/053* (2013.01); *H01L 23/3675* (2013.01); *H01L 25/0657* (2013.01); *H05K 1/0206* (2013.01); *H05K 3/30* (2013.01); *H01L 2225/06589* (2013.01)

(58) Field of Classification Search
CPC ...... H05K 7/2039; H05K 1/0206; H05K 3/30; H01L 21/4882; H01L 23/053; H01L 23/3675; H01L 25/0657
See application file for complete search history.

(56) References Cited

U.S. PATENT DOCUMENTS

| | | | | |
|---|---|---|---|---|
| 8,482,111 B2* | 7/2013 | Haba | | H01L 21/565 257/686 |
| 8,525,318 B1* | 9/2013 | Kim | | H01L 23/3128 257/686 |
| 8,749,989 B1* | 6/2014 | Kaylie | | H05K 1/09 361/768 |
| 8,766,429 B2* | 7/2014 | Kim | | H01L 23/552 257/659 |
| 9,362,235 B2* | 6/2016 | Kim | | H01L 23/552 |
| 2008/0258293 A1 | 10/2008 | Yang et al. | | |
| 2009/0206461 A1* | 8/2009 | Yoon | | H01L 21/565 257/686 |
| 2011/0140259 A1* | 6/2011 | Cho | | H01L 25/16 257/686 |
| 2014/0133105 A1 | 5/2014 | Yee et al. | | |

FOREIGN PATENT DOCUMENTS

| | | |
|---|---|---|
| WO | 2007/078996 A2 | 7/2007 |
| WO | 2012/159533 A1 | 11/2012 |

* cited by examiner

*Primary Examiner* — Robert J Hoffberg
*Assistant Examiner* — Hung Dang
(74) *Attorney, Agent, or Firm* — Dennis R. Haszko

(57) ABSTRACT

An apparatus for cooling a POP stacked package within a small form factor electronic module by configuring the enclosure of the module to come into direct contact with the device on the top surface in addition to the bottom surface to create two thermal conduction paths for the POP device to the enclosure. The enclosure itself then acts as the heat sink to draw heat from the device and into the surrounding air external to the optical module.

18 Claims, 4 Drawing Sheets

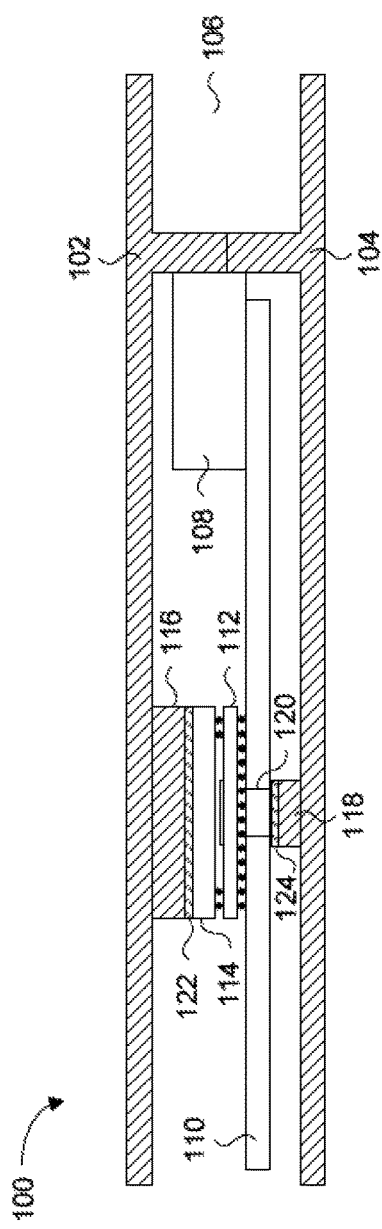
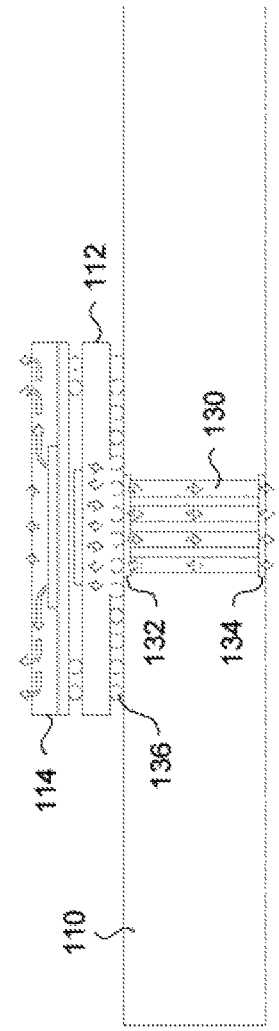
FIG. 3
FIG. 4

ELECTRONIC MODULE WITH COOLING SYSTEM FOR PACKAGE-ON-PACKAGE DEVICES

FIELD

The present disclosure relates generally to cooling components in electronic modules having small volumes.

BACKGROUND

In many electronic systems, small electronic modules containing a printed circuit board (PCB) with packaged semiconductor devices mounted thereon are used to provide some specific type of functionality. The electronic module may facilitate assembly and/or protect the components housed inside. For example, an optical module may have an optical connector for receiving optical signals, where the connector can be configured as a female receptacle for receiving a complementary shaped male plug. Inside, the optical module may devices for converting the optical signal into an electrical signal, as well as logic processing devices and memory for operating upon the electrical signal.

FIG. 1 shows an example optical module of the prior art. Optical module 10 includes an optical connector 12 in the form of a female receptacle, and is composed of a top enclosure 14 and a bottom enclosure 16. The use of terms "top" and "bottom" are arbitrary, and specifically refer to the relative position of the enclosure portions shown in FIG. 1. Electronic modules such as optical module 10 of FIG. 1 can be referred to as SFP (Small Form-Factor Pluggable) or QSFP (Quad SFP) enclosures. Regardless the type of enclosure, they are intended to have the smallest possible form factor.

Unfortunately, the packaged devices within the electronic module generate heat during normal operation. By example, the electronic module can contain package on package (POP) devices, which are a widely used packaging technology to three dimensionally integrate multiple functions into a single form factor. In the vast majority of cases, the POP stack comprises a logic processor chip onto which a DRAM package is placed on top. Both devices of the POP stack generate heat during the normal course of operation. This generation of heat by both devices of the POP stack is undesired as excessive heat can cause both devices to fail. The primary failure mechanism due to excessive heat is thermal runaway, where heat increases the amount of leakage current from the circuits, which then creates additional device power to increase the heat output. This problem loops continuously until catastrophic failure occurs, or the device simply fails to operate properly any further.

In an optical module such as an SFP, the volume constraints of the form factor do not allow many options for removing heat from the internal devices as proper cooling involves physically moving heat as far from the thermal source as possible. Optical modules have very stringent thermal specifications and require operation in ambient temperatures of up to 70 C. In the best of cases, cooling of a POP in the optical module is challenging, and for integration into an optical module, a novel cooling method to allow reliable operation is required.

It is therefore desirable to remove heat from the internal devices and into the surrounding environment without introducing additional power consuming components into the system.

SUMMARY

It is an object of the present disclosure to obviate or mitigate at least one disadvantage of previous cooling systems for electronic modules housing packaged semiconductor devices.

In a first aspect, the present disclosure provides an electronic device module having a stacked package-on-package (POP) device, and a thermal conducting enclosure housing the POP device, where the enclosure is in thermal contact with both packages of the POP device for dissipating heat generated by the packages. In an embodiment, the thermal conducting enclosure includes a top enclosure portion and a bottom enclosure portion. The top enclosure portion includes a first heat conducting pedestal in thermal contact with a surface of a first package of the POP device, and the bottom enclosure portion includes a second heat conducting pedestal in thermal contact with solder balls of a second package of the POP device. In this embodiment, the first heat conducting pedestal is integrally formed with the top enclosure portion and the second heat conducting pedestal is integrally formed with the bottom enclosure portion. Alternately, the first heat conducting pedestal is attached to the top enclosure portion and the second heat conducting pedestal is attached to the bottom enclosure portion.

In a variation of the present embodiment, the top enclosure portion includes a sidewall and the first heat conducting pedestal is in contact with the sidewall, or the bottom enclosure portion includes a sidewall and the second heat conducting pedestal is in contact with the sidewall. In the previous embodiment, the electronic device module further includes a printed circuit board (PCB) inside the enclosure having thermal vias extending from a first surface to a second surface of the PCB, wherein a second package of the POP device has connections connected to the thermal vias, and the second heat conducting pedestal is connected to the thermal vias. Alternately, the electronic device module further includes a printed circuit board (PCB) inside the enclosure, and includes a first contact pad, a second contact pad and thermal vias. The first contact pad is on a first surface of the PCB and connected to connections of a second package of the POP device. The second contact pad is on a second surface of the PCB and connected to the second heat conducting pedestal. The thermal vias extend from the first contact pad to the second contact pad.

In yet another variation of the present embodiment, the electronic device module further includes a printed circuit board (PCB) inside the enclosure having a hole formed therein, and a first package of the POP device positioned over the hole, where the second heat conducting pedestal is directly connected to the solder balls of the second package of the POP through the hole.

In a second aspect, the present disclosure provides an electronic device module having a thermal conducting enclosure, a printed circuit board (PCB) inside the enclosure, a package-on-package (POP) device, a first heat conducting pedestal, and a second heat conducting pedestal. The thermal conducting enclosure has a first wall and a second wall opposing the first wall. The PCB inside the enclosure has thermal vias extending from a first surface to a second surface of the PCB. The POP device includes a first package having connections thermally coupled to the thermal vias, and a second package mounted on the first package to form a stack. The first heat conducting pedestal is in contact with the first wall and the second package, for conducting heat from the second package to the enclosure. The second heat conducting pedestal is in contact with the second wall and thermally coupled to the thermal vias, for conducting heat from the first package to the enclosure.

According to a present embodiment, the first heat conducting pedestal is integrally formed with the first wall and the second heat conducting pedestal is integrally formed with the second wall. In another embodiment of the second aspect the first wall is connected to a sidewall and the first heat conducting pedestal is in contact with the sidewall, or the second wall is connected to a sidewall and the second heat conducting pedestal is in contact with the sidewall. In yet another embodiment of the second aspect, the connections of the first package are connected to the thermal vias, and the second heat conducting pedestal is connected to the thermal vias.

In a further embodiment, the PCB includes a first contact pad and a second contact pad. The first contact pad is located on a first surface and connected to the connections of the first package. The second contact pad is located on a second surface and connected to the second heat conducting pedestal. The thermal vias extend from the first contact pad to the second contact pad.

In a third aspect, the present disclosure provides method for manufacturing an electronic device module. The method includes producing a top enclosure portion and a bottom enclosure portion each with heat conducting pedestals; assembling a printed circuit board (PCB) with a stacked package-on-package (POP) device; and assembling the electronic device module with the heat conducting pedestals thermally coupled to each package of the POP device.

According to one embodiment of the third aspect, producing includes casting the top enclosure portion and the bottom enclosure portion with the heat conducting pedestals integrally formed therein, or producing includes attaching the heat conducting pedestals to the top enclosure portion and the bottom enclosure portion. According to another embodiment of the third aspect, assembling the electronic device module includes applying thermal interface material (TIM) to the heat conducting pedestals; installing the PCB into the bottom enclosure portion; and securing the top enclosure portion to the bottom enclosure portion.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached Figures.

FIG. 3 is a cross-sectional view of an optical module configured with a cooling system, according to a present embodiment;

FIG. 4 is an enlarged cross-section view of the PCB showing heat conducting vias, according to a present embodiment; and, FIG. 5 is a flow chart outlining a method for forming an optical module with cooling system, according to a present embodiment.

DETAILED DESCRIPTION

Generally, the present disclosure provides a method and apparatus for cooling a POP stacked package within a small form factor optical module by configuring the enclosure of the module to come into direct contact with the device on the top surface in addition to the bottom surface to create two thermal conduction paths for the POP device to the enclosure. The enclosure itself then acts as the heat sink to draw heat from the device and into the surrounding air external to the optical module.

Figure 1:
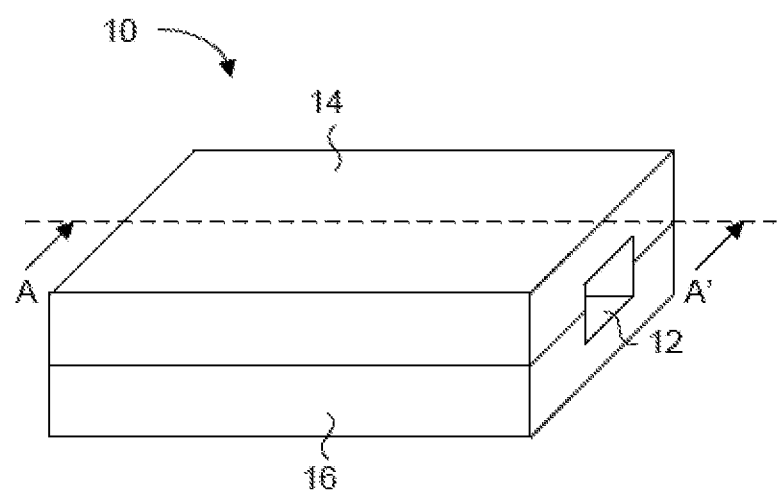
FIG. 1 is an example optical module of the prior art.
Figure 2:
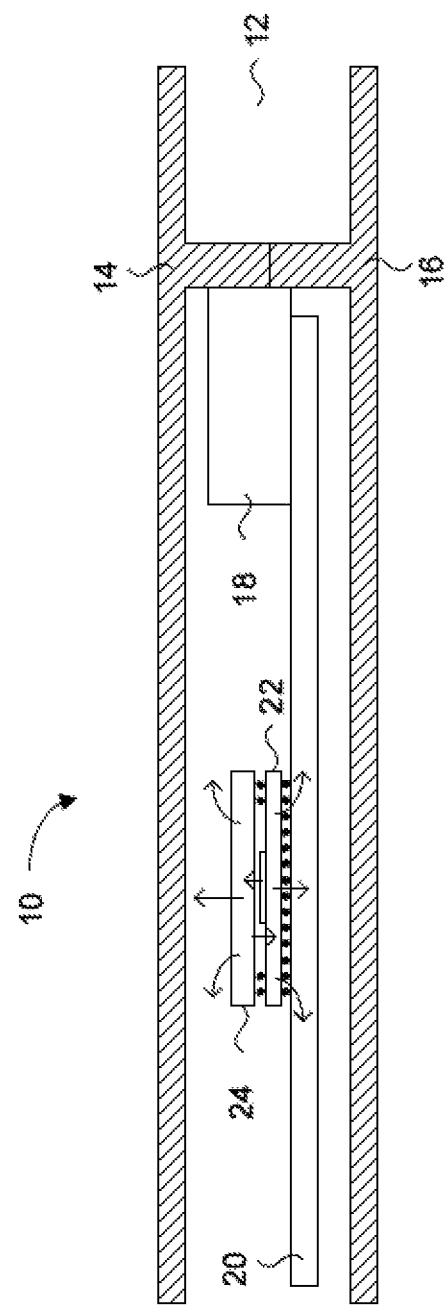
FIG. 2 is a cross-sectional view of the optical module of FIG. 1 taken along line A-A'.

FIG. 2 is a cross-sectional view of the optical module 10 of FIG. 1 taken along line A-A' to illustrate a problem with current optical modules. Housed within the top enclosure 14 and bottom enclosure 16 is an optical sub-assembly 18 connected to the optical connector 12, a printed circuit board (PCB) 20, and a POP stack consisting of a first device package 22 and a second device package 24. The optical sub-assembly 18 may contain circuits to convert the received optical signal into an electrical signal, which are then provided to the POP stack via conductor traces of the PCB. The POP stack typically includes a logic device, such as a processor by example, and a memory device such as a DRAM. In the present example, the first device package 22 can be the processor and the second device package 24 can be the memory device.

As shown in FIG. 2, one side of the first device package 22 can have a ball grid array in electrical connection to the PCB. The second device package 24 can have a ball grid array connected to corresponding pads on the other side of the first device package 22. The ball grid array is just one example of package connectors, and different types of package connectors can be used instead. As shown by the arrows extending from the packages 22 and 24 in FIG. 2, heat generated by the packages will emanate into the surrounding volume of the enclosure 10, into the PCB 20, and into each other.

It can be seen that POP technology introduces constraints and limitations on its use. Firstly power must be low enough so as not to overwhelm the limited thermal dissipation paths that exist for the package stack. Second, because the inherent nature of the package contains a minimum of two thermal sources, care must be taken so that the thermal dissipation methodology implemented adequately deals with both thermal sources.

According to a present embodiment, an electrical module is configured to include a cooling system for dissipating generated heat by internal POP devices. FIG. 3 shows a cross-sectional view of a module similar to the module 10 shown in FIG. 1, according to a present embodiment. Optical module 100 includes a top enclosure 102, a bottom enclosure 104, an optical connector 106, an optical sub-assembly 108, a PCB 110 and a POP stack including packages 112 and 114. The POP device cooling system includes a first heat conducting pedestal 116 in contact with top enclosure 102, a second heat conducting pedestal 118 in contact with bottom enclosure 104 and thermal vias 120 formed within PCB 110. The top and bottom enclosures 102 and 104 are made of a heat conducting material, such as metal.

It is noted that the first heat conducting pedestal 116 can be shaped to be at least about the same as the exposed surface area of the package 114. In one embodiment, having a pedestal 116 shaped to be about the same as the exposed surface area of the package 114 both maximizes contact area between the package surface 114 and the pedestal 116, while minimizing intrusion into the internal volume of the module 100. In alternate embodiments, the pedestal 116 can have an area that is larger than the exposed surface area of the package 114. While such an embodiment improves thermal conduction of heat away from the package 114, the larger pedestal 116 will occupy internal module volume and thereby limit the installation of other components within module 100.

The first heat conducting pedestal 116 is made of a heat conducting material, such as metal, and can be attached to top enclosure 102 or integrally formed with top enclosure 102 during casting. Alternate pedestal and/or enclosure formation techniques include, and are not limited to, machining, forging and extrusion. The second heat conducting pedestal 118 is made of a heat conducting material, such as metal, and can be attached to bottom enclosure 104 or integrally formed with bottom enclosure 104 during casting. The first heat conducting pedestal 116 is thermally connected to package 114 via thermal interface material (TIM) 122. The TIM can be a compressible and deformable material to aid in achieving manufacturing tolerances as well as to reduce the contact resistance between the enclosure and the package. Accordingly, the top enclosure 102 is in thermal contact with the package 114 because of the thermal path provided by contact of the pedestal 116 to the top surface of package 114. Similarly, the second heat conducting pedestal 118 is thermally connected to a bottom side of PCB 110 via TIM 124. The thermal vias 120 are generally shown as an area of the PCB 110, but are actually columns of metal which extend through the entire thickness of PCB 110 and are exposed at both surfaces of PCB 110. Accordingly, the bottom enclosure 104 is in thermal contact with package 112 because of the thermal path provided by contact of the pedestal 118 to the thermal vias 120 which are connected to the solder balls of package 112.

FIG. 4 shows a more detailed cross-sectional view of just the POP stack and PCB 110 of FIG. 3. The thermal vias 120 of FIG. 3 are shown in more detail in FIG. 4. In the present example of FIG. 4, four columns of thermal vias 130 extend through the thickness of the PCB 110 and make contact with contact top and bottom contact pads 132 and 134. The contact pads are optional, and facilitate contact with some of the solder balls 136 of the package 112, and the TIM 124 with second heat conducting pedestal 118. The arrows in FIG. 4 illustrate the direction of heat transfer from packages 112 and 114 when thermally connected to the heat conducting pedestals 116 and 118. Because of heat pedestal 116 being thermally connected to package 114, any generated heat is directed towards the top enclosure 102. Similarly, the combination of thermal vias 130, contact pads 132 and 134, and heat pedestal 118 directs any generated towards the bottom enclosure 104.

Therefore, both the top package 114 and the bottom package 112 can be kept to within operating temperatures by allowing their generated heat to escape into the ambient environment of the electrical module instead of being trapped within the volume of the electrical module.

It should be noted that the thermal vias 130 are positioned on the PCB 110 for contact with solder balls designated as ground. For example, if a central part of the package 112 has a 3×3, 4×4 or 6×6 array of solder balls that are designated as ground, then a corresponding number of thermal vias 130 can be formed in PCB 110 with matching positions and pitch there between. Alternatively, if contact pad 132 is used, then thermal vias 130 of any number having any shape and pitch can be used because the pad 132 maintains contact with the proper solder balls. In different embodiments, any number of thermal vias 130 can be used, depending on where the ground designated solder balls are located on package 112. It is noted that these ground designated solder balls are further connected to ground through traces of the PCB that are ultimately connected to ground.

In an alternate embodiment to the configuration of FIG. 3, the module enclosures 102 and 104 are grounded. In such an embodiment the central array of solder balls designated as ground can be directly connected to the pedestal 118 which acts as ground. For this embodiment, a hole can be formed in PCB 110 to allow a longer pedestal 118 to extend there through and make contact with the central array of solder balls without the need for thermal vias 120. In further variations, multiple holes can be formed in PCB 110 to allow multiple corresponding thermal pedestals to make direct contact with the solder balls of package 112.

The previous embodiment of the electrical module with cooling system has the heat conducting pedestals 116, 118 in thermal contact with the top and bottom enclosures 102, 104 respectively. In an alternate embodiment, the heat conducting pedestals 116, 118 can be shaped or extended to make contact with a sidewall of the enclosure. If required, the POP device can be positioned towards the sidewall to facilitate such contact. In yet a further embodiment, at least one heat conducting pedestal can be configured to contact both the sidewall and top (or bottom) surfaces of the enclosure to increase the contact area of the pedestal to the enclosure, thereby improving heat conduction away from the package.

Figure 5:
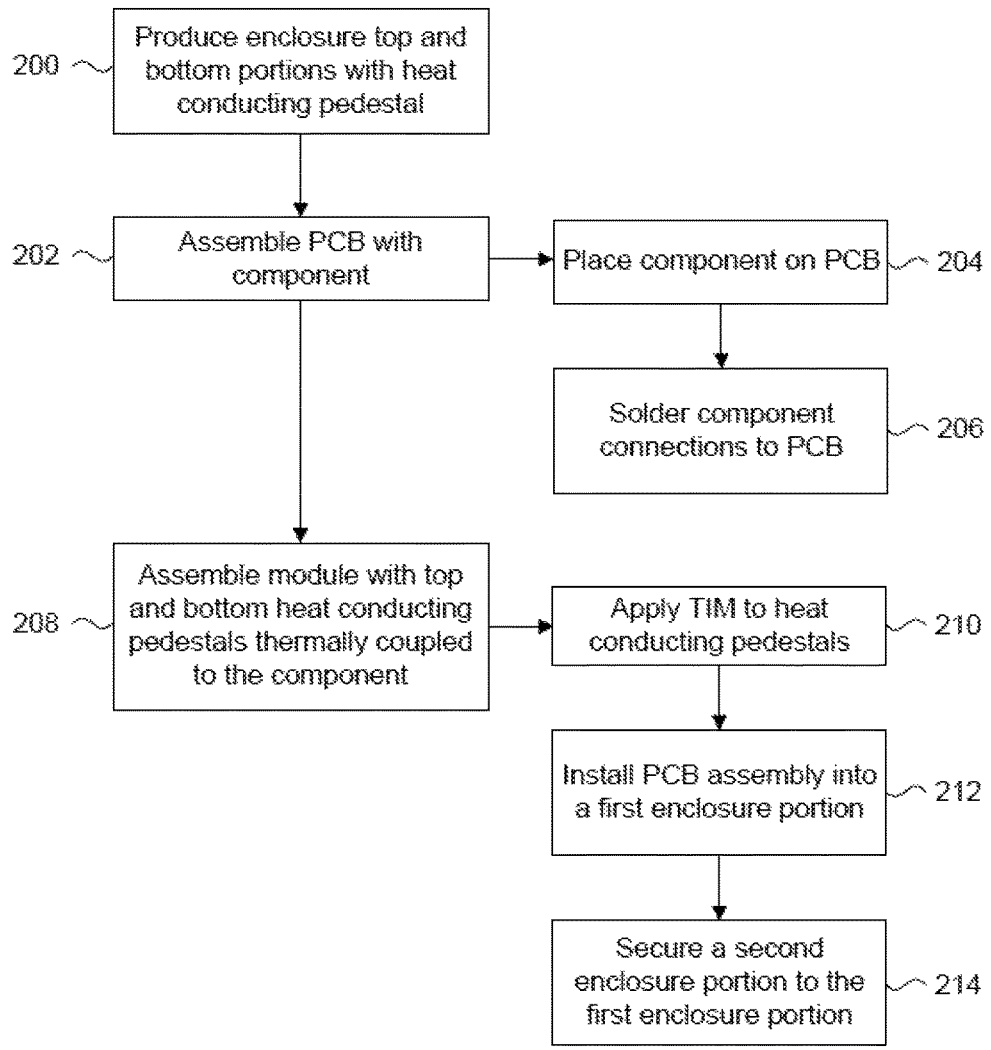

The previously described embodiments of the electrical module with cooling system can be manufactured according to the flow chart of FIG. 5. It is assumed that the position of the POP package on the PCB, the position of the PCB within the enclosure, and the position of the thermal vias of the PCB have been predetermined, thus the positions for the pedestals on the enclosure can be aligned to ensure thermal contact is made with the POP. The manufacturing method begins at 200 with manufacture of the top and bottom portions of the electrical module. This can include casting the enclosures with their respective pedestals as a unitary structure. Alternately, this step can include casting just the enclosures, and attaching the pedestals to the enclosures later. The attachment method should ensure that thermal conduction is maximized between the pedestal and the enclosure.

Proceeding to 202, the PCB is assembled with the POP. This can include placing the POP on the PCB at 204 and then soldering the POP to the PCB at 206. Additional components would be placed and soldered during this PCB assembly step. The top and bottom portions of the enclosure and the PCB with soldered components are assembled at 208. This includes applying TIM to the heat conducting pedestals and/or the top package of the POP and the bottom surface of the PCB at 210, followed by installing the PCB into one of the enclosure portions at 212, and finally securing the second enclosure portion to the first enclosure portion at 214. Now the electrical module with cooling system is assembled and ready for use.

The previously shown and described electrical module with cooling system allows use of higher power POP devices to realize higher performance modules. And since the POP devices do not need to be implemented as separate packages to address the cooling problem, valuable PCB area is saved to result in smaller form factor modules. As the previously disclosed cooling system is passive, no additional componentry or power is required.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art. The scope of the claims should not be limited by the particular embodiments set forth herein, but should be construed in a manner consistent with the specification as a whole.

What is claimed is:

1. An electronic device module, comprising:
a package-on-package (POP) device including a first package stacked on a second package; and
a thermal conducting enclosure housing the POP device and having a top enclosure portion and a bottom enclosure portion;
a first heat conducting pedestal in thermal contact and adjacent to a surface of the first package and in thermal contact and adjacent to the top enclosure portion for dissipating heat generated by the first package;
a second heat conducting pedestal in thermal contact with connections of the second package and in thermal contact and adjacent to the bottom enclosure portion for dissipating heat generated by the second package, the second heat conducting pedestal being positioned between the second package and the bottom enclosure portion.

2. The electronic device module of claim 1 wherein the first heat conducting pedestal is integrally formed with the top enclosure portion and the second heat conducting pedestal is integrally formed with the bottom enclosure portion.

3. The electronic device module of claim 1, wherein the first heat conducting pedestal is attached to the top enclosure portion and the second heat conducting pedestal is attached to the bottom enclosure portion.

4. The electronic device module of claim 1, wherein the top enclosure portion includes a sidewall and the first heat conducting pedestal is in thermal contact with the sidewall.

5. The electronic device module of claim 1, wherein the bottom enclosure portion includes a sidewall and the second heat conducting pedestal is in thermal contact with the sidewall.

6. The electronic device module of claim 1, further including a printed circuit board (PCB) inside the enclosure and having thermal vias extending from a first surface to a second surface of the PCB, wherein the second package of the POP device has the connections connected to the thermal vias, and the second heat conducting pedestal is connected to the thermal vias.

7. The electronic device module of claim 1, further including a printed circuit board (PCB) inside the enclosure having
a first contact pad on a first surface of the PCB connected to the connections of the second package of the POP device,
a second contact pad on a second surface of the PCB opposing the first surface, connected to the second heat conducting pedestal, and
thermal vias extending from the first contact pad to the second contact pad.

8. The electronic device module of claim 1, further including
a printed circuit board (PCB) inside of the enclosure, the PCB having a hole formed therein, and
the second first package of the POP device positioned over the hole, and the second heat conducting pedestal is directly connected to the connections of the second package of the POP device through the hole.

9. An electronic device module, comprising:
a thermal conducting enclosure having a first wall and a second wall opposing the first wall;
a printed circuit board (PCB) inside of the enclosure, the PCB having thermal vias extending from a first surface of the PCB to a second surface of the PCB opposing the first surface;
a package-on-package (POP) device including a first package having connections thermally coupled to the thermal vias, and a second package mounted on the first package to form a stack;
a first heat conducting pedestal in contact with the first wall and the second package, for conducting heat from the second package to the enclosure; and
a second heat conducting pedestal in contact with the second wall and thermally coupled to the thermal vias, for conducting heat from the first package to the enclosure.

10. The electronic device module of claim 9, wherein the first heat conducting pedestal is integrally formed with the first wall and the second heat conducting pedestal is integrally formed with the second wall.

11. The electronic device module of claim 9, wherein the first wall is connected to a sidewall of the enclosure and the first heat conducting pedestal is in further contact with the sidewall.

12. The electronic device module of claim 9, wherein the second wall is connected to a sidewall of the enclosure and the second heat conducting pedestal is in further contact with the sidewall.

13. The electronic device module of claim 9, wherein the connections of the first package are connected to the thermal vias, and the second heat conducting pedestal is connected to the thermal vias.

14. The electronic device module of claim 9, wherein the PCB includes
a first contact pad on the first surface connected to the connections of the first package, and
a second contact pad on the second surface connected to the second heat conducting pedestal, the thermal vias extending from the first contact pad to the second contact pad.

15. A method for manufacturing an electronic device module, comprising:
- producing a top enclosure portion and a first heat conducting pedestal;
- producing a bottom enclosure portion and a second heat conducting pedestal;
- assembling a printed circuit board (PCB) with a package-on-package (POP) device including a first package stacked on a second package; and
- assembling the electronic device module with the first heat conducting pedestal and the second heat conducting pedestal each thermally coupled to a respective package of the POP device, wherein
- the first heat conducting pedestal is in thermal contact and adjacent to a surface of the first package and adjacent to the top enclosure portion for dissipating heat generated by the first package, and
- the second heat conducting pedestal is in thermal contact with connections of the second package and in thermal contact and adjacent to the bottom enclosure portion for dissipating heat generated by the second package, the second heat conducting pedestal being positioned between the second package and the bottom enclosure portion.

16. The method of claim 15, wherein producing includes casting the top enclosure portion with the first heat conducting pedestal integrally formed therewith, and casting the bottom enclosure portion with the second heat conducting pedestal integrally formed therewith.

17. The method of claim 15, wherein producing includes attaching the first heat conducting pedestal to the top enclosure portion and attaching the second heat conducting pedestal to the bottom enclosure portion.

18. The method of claim 15, wherein assembling the electronic device module includes
- applying a thermal interface material (TIM) to each of the first heat conducting pedestal and the second heat conducting pedestal,
- installing the PCB into the bottom enclosure portion, and
- securing the top enclosure portion to the bottom enclosure portion for encasing the PCB.

* * * * *